US007795785B2

(12) United States Patent
Hayashi et al.

(10) Patent No.: US 7,795,785 B2
(45) Date of Patent: Sep. 14, 2010

(54) ULTRASONIC SENSOR

(75) Inventors: Seigo Hayashi, Kanazawa (JP); Shinji Amaike, Ishikawa-gun (JP); Masanaga Nishikawa, Kanazawa (JP); Kazuo Shima, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 249 days.

(21) Appl. No.: 12/189,872

(22) Filed: Aug. 12, 2008

(65) Prior Publication Data

US 2008/0289428 A1 Nov. 27, 2008

Related U.S. Application Data

(63) Continuation of application No. PCT/JP2006/322927, filed on Nov. 17, 2006.

(30) Foreign Application Priority Data

Feb. 14, 2006 (JP) ............................ 2006-036226

(51) Int. Cl.
*H01L 41/08* (2006.01)

(52) U.S. Cl. ...................................... 310/334; 310/340

(58) Field of Classification Search ......... 310/334–337, 310/340, 344, 348
See application file for complete search history.

(56) References Cited

U.S. PATENT DOCUMENTS 3,890,423 A * 6/1975 Zacharias, Jr. .............. 310/335
3,950,660 A * 4/1976 McElroy ...................... 310/336
4,549,107 A * 10/1985 Kaneko et al. .............. 310/327
6,374,676 B1 4/2002 Arnold et al.
6,946,777 B2 * 9/2005 Owen ......................... 310/334
7,548,014 B2 * 6/2009 Asada et al. ................ 310/348
2003/0121331 A1 7/2003 Mitsuoka et al.
2008/0290758 A1 * 11/2008 Hayashi et al. ............. 310/326

FOREIGN PATENT DOCUMENTS

DE 197 44 229 A1 4/1999
EP 0 940 800 B1 9/1999

(Continued)

OTHER PUBLICATIONS

Official Communication issued in International Patent Application No. PCT/JP2006/322927, mailed on Dec. 19, 2006.

(Continued)

*Primary Examiner*—Thomas M Dougherty
(74) *Attorney, Agent, or Firm*—Keating & Bennett, LLP

(57) ABSTRACT

An ultrasonic sensor includes a cylindrical case with a bottom. A piezoelectric element is bonded to an inner side of a bottom portion of the case, and a felt is bonded to the piezoelectric element. A cap is fitted to an opening of the case. The cap includes a fixing portion and a substrate which is harder than the fixing portion. Terminals are press-fitted to the substrate. Wires are connected to the terminals, so that the terminals are electrically connected to the piezoelectric element. A through hole is provided in the fixing portion. Resin before being foamed is injected from the through hole and then foamed, so that the case is filled with foamable resin while an excess amount of foamable resin is pushed out from the through hole.

5 Claims, 6 Drawing Sheets

FOREIGN PATENT DOCUMENTS

| | | | | |
|---|---|---|---|---|
| JP | 49-112101 | U | | 9/1974 |
| JP | 56-041427 | U | | 4/1981 |
| JP | 07-011100 | U | | 2/1995 |
| JP | 11-018188 | A | | 1/1999 |
| JP | 11-266498 | A | | 9/1999 |
| JP | 2001-197592 | A | * | 7/2001 |
| JP | 2002-058097 | A | | 2/2002 |
| JP | 2002-209294 | A | * | 7/2002 |
| JP | 2006-279113 | A | * | 10/2006 |
| WO | 02/65446 | A1 | | 8/2002 |

OTHER PUBLICATIONS

Official Communication issued in corresponding European Patent Application No. 06832806.1, mailed on Jun. 18, 2010.

* cited by examiner

1

ULTRASONIC SENSOR

BACKGROUND OF THE INVENTION

1. Field of the Invention

The present invention relates to ultrasonic sensors, and more particularly, to an ultrasonic sensor preferably for use as, for example, a backup sensor of an automobile.

2. Description of the Related Art

FIG. 6 is a schematic illustration showing an exemplary ultrasonic sensor according to a related art. An ultrasonic sensor 1 includes a cylindrical case 2 with a bottom portion, the case 2 being made of aluminum or other suitable material. An inner side of a bottom of the case 2 is connected to one side of a piezoelectric element 3. The case 2 is substantially entirely filled with foamable resin 4, such as foamable silicon, so as to surround the piezoelectric element 3. Also, a substrate 6 having terminals 5*a* and 5*b* is attached to an opening of the case 2 so as to cover the foamable resin 4. Provided on both sides of the substrate 6 are electrodes 7*a* and 7*b* which are connected to the terminals 5*a* and 5*b*. The one terminal 5*a* is connected to the other side of the piezoelectric element 3 via the electrode 7*a* provided on the inner side of the substrate 6, and via a wire 8. The other terminal 5*b* is connected to the one side of the piezoelectric element 3 via the electrode 7*b* provided on the outer side of the substrate 6, via a solder 9, and via the case 2.

Using the ultrasonic sensor 1 to measure the distance between the ultrasonic sensor 1 and an object to be detected, the piezoelectric element 3 is excited by applying a drive voltage to the terminals 5*a* and 5*b*. As the piezoelectric element 3 is vibrated, the bottom of the case 2 is vibrated, which causes ultrasound to be emitted to a direction substantially perpendicular to the bottom as indicated by an arrow shown in FIG. 6. When the ultrasound emitted from the ultrasonic sensor 1 is reflected by the object to be detected and reaches the ultrasonic sensor 1, the piezoelectric element 3 is vibrated, the vibration is converted into an electric signal, and the electric signal is output from the terminals 5*a* and 5*b*. A period of time from the application of the drive voltage to the output of the electric signal is measured, so that a distance between the ultrasonic sensor 1 and the object to be detected may be measured.

With the ultrasonic sensor 1, since the inside of the case 2 is filled with the foamable resin 4, the vibration of the entire case 2 may be reduced. Also, the ultrasound emitted to the inside of the case 2 is dispersed and absorbed by a large number of pores in the foamable resin 4. This may efficiently reduce not only the vibration of the case 2, but also the ultrasound remaining in the case 2, thereby improving the reverberation property (see Japanese Unexamined Patent Application Publication No. 11-266498).

To fill the case with the foamable resin, if the resin is injected into the case and then foamed before the substrate is attached to the case, then the foamable resin may come out from the opening of the case. As a result, only a small internal pressure is applied. Accordingly, the case may not be evenly filled with the foamable resin at the corners thereof. If the case is not evenly filled with the foamable resin, the reverberation property may be deteriorated. Also, if the resin is injected into the case and is foamed after the substrate is attached to the case such that the internal pressure is increased, the foamable resin pushes the substrate from the inside of the case, the substrate is deformed, and thus, the foamable resin may be unevenly filled in the case.

SUMMARY OF THE INVENTION

To overcome the problems described above, preferred embodiments of the present invention provide an ultrasonic sensor which allows a case to be evenly filled with foamable resin and which has outstanding properties.

A preferred embodiment of the present invention provides an ultrasonic sensor including a cylindrical case having a bottom portion, a piezoelectric element disposed on an inner side of the bottom portion of the case, foamable resin which is injected into the case so as to surround the piezoelectric element, a cap attached to an opening of the case, a terminal attached to the cap so as to be electrically connected to the piezoelectric element, and a through hole provided in the cap.

By forming the through hole in the cap, the resin may be injected into the case from the through hole after the cap is attached to the case with the piezoelectric element provided. The resin in the case is foamed, so that the case is filled with the foamable resin, and an excess amount of the foamable resin is pushed out from the through hole in the cap. Accordingly, a suitable internal pressure is applied to the foamable resin and the foamable resin is evenly spread in the case. This may allow the case to be evenly filled with the foamable resin.

In this ultrasonic sensor, a sectional area of the through hole may preferably be determined by conditions of $Sh \leqq 5$ ($mm^2$), and $0.02 \leqq Sh/Sc \leqq 0.3$, where Sc is a sectional area of the opening of the case, and Sh is the sectional area of the through hole provided in the cap.

With such conditions, the suitable internal pressure is applied when the resin is foamed, thereby allowing the case to be evenly filled with the foamable resin. If the sectional area of the through hole is too large, when the resin injected into the case is foamed, the foamable resin is more likely to be pushed out from the through hole, the pressure in the case becomes small, and thus, the case may not be evenly filled with the foamable resin at the corners thereof. If the sectional area of the through hole is too small, when the resin injected into the case is foamed, the foamable resin may not be pushed out from the through hole, the internal pressure becomes too large, and thus, the cap may be deformed, and the case may not be evenly filled with the foamable resin.

Also, the cap may preferably include a soft fixing portion which is fixed to the case, and a substrate which is provided in the fixing portion and is harder than the fixing portion. The terminal may be attached to the substrate.

Using a hard material for the cap may increase a fixing strength of the terminal. However, even though the fixing portion is made of the relatively soft material, the fixing strength of the terminal may be increased as long as the substrate to which the terminal is attached is made of the hard material.

Where the cap includes the fixing portion and the substrate, the case and the fixing portion may be fixed by engaging portions, and the fixing portion and the substrate may be fixed by engaging portions.

By fixing the case and the fixing portion by the engaging portions, and fixing the fixing portion and the substrate by the engaging portions, these components may be easily fixed. In addition, the position of the substrate with respect to the case may be determined by the fixture via the engaging portions. Accordingly, the position of the terminal is accurate.

Also, where the cap includes the fixing portion and the substrate, the opening of the case, the fixing portion, and the substrate may have substantially circular cross-sections, and the opening of the case, the fixing portion, and the substrate may be concentrically arranged.

As the opening of the case, the fixing portion, and the substrate have substantially circular cross-sections, and are concentrically arranged, the stress applied from the fixing portion to the substrate may be equally distributed. Therefore, the position of the substrate is not shifted with respect to the case and the fixing portion, the positional accuracy of the terminal attached to the substrate may be increased, and consequently, the terminal may be precisely positioned at a designed position.

With preferred embodiments of the present invention, the resin is injected into the case and then foamed, so that the foamable resin may be spread in the case with a suitable internal pressure while an excess amount of foamable resin is pushed out from the through hole in the cap. Accordingly, the case may be evenly filled with the foamable resin, and the ultrasonic sensor may have an outstanding reverberation property.

The above and other elements, features, steps, characteristics, and advantages of this invention will become apparent from the description of preferred embodiments and the best mode for carrying out the present invention with reference to the drawings.

DETAILED DESCRIPTION OF PREFERRED EMBODIMENTS

Figure 1:
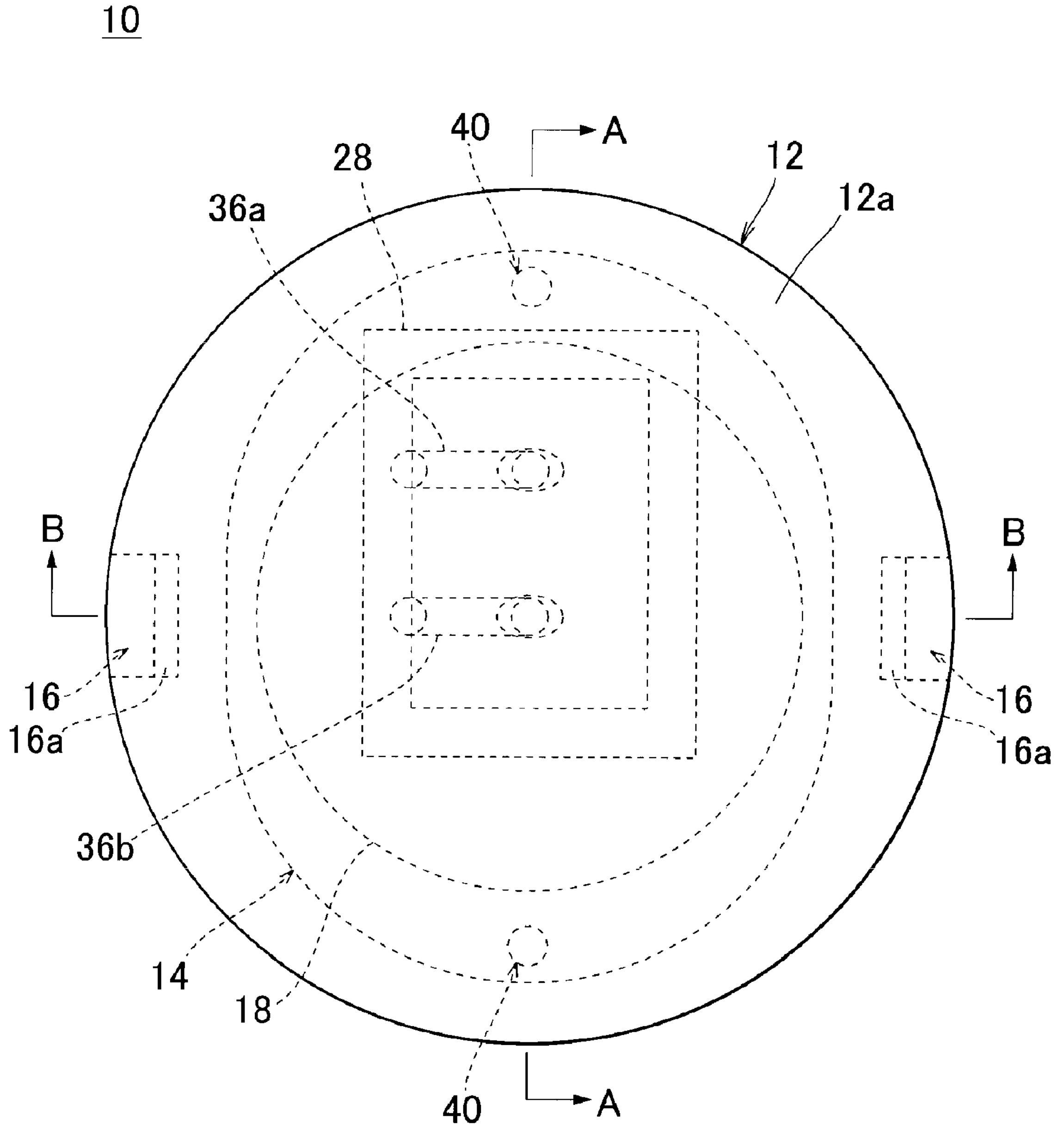
FIG. 1 is a plan view showing an ultrasonic sensor according to a preferred embodiment of the present invention.

FIG. 1 is a plan view showing an ultrasonic sensor according to a preferred embodiment of the present invention.

Figure 2:
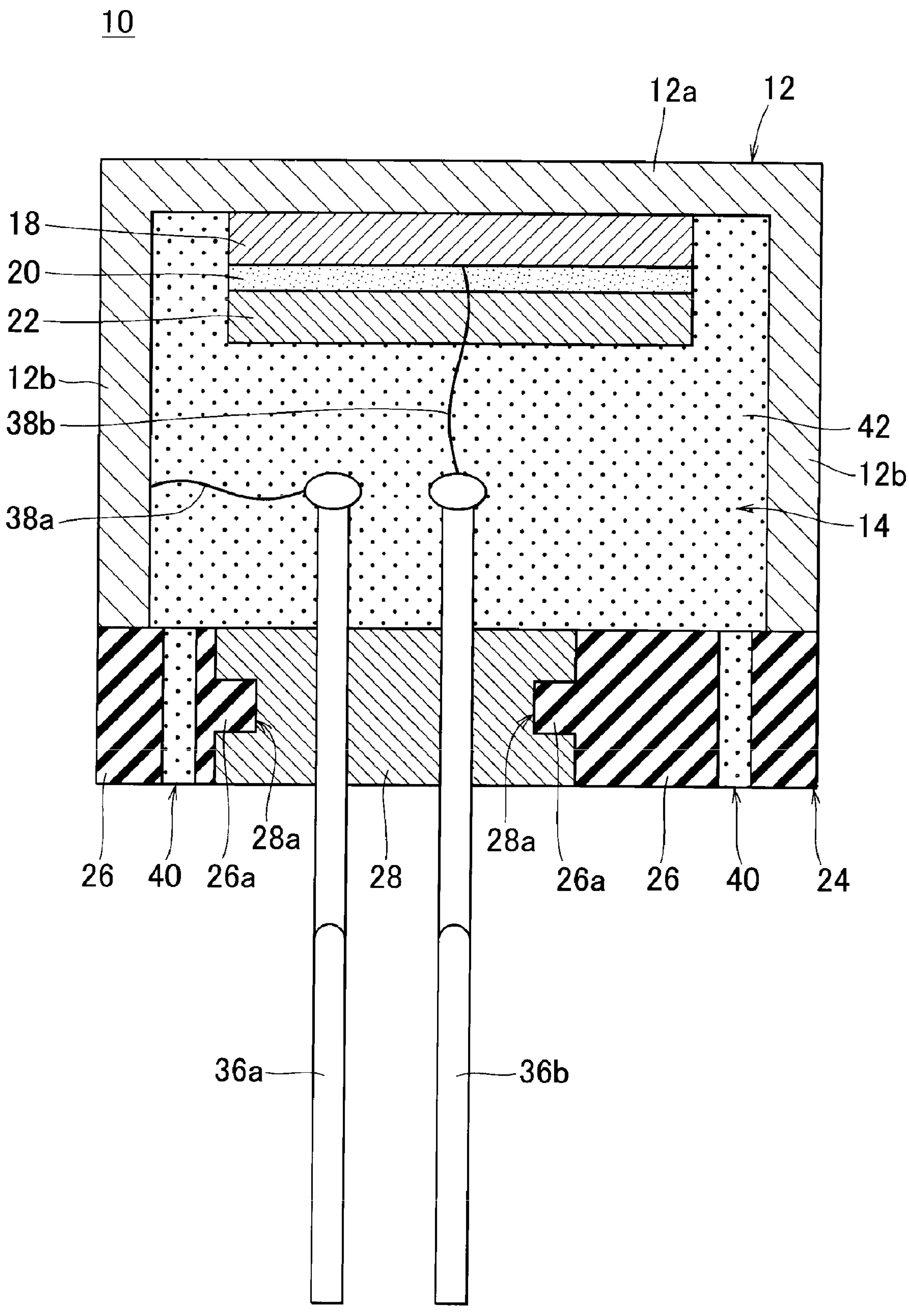
FIG. 2 is a cross-sectional view showing the ultrasonic sensor taken along a line A-A shown in FIG. 1.
Figure 3:
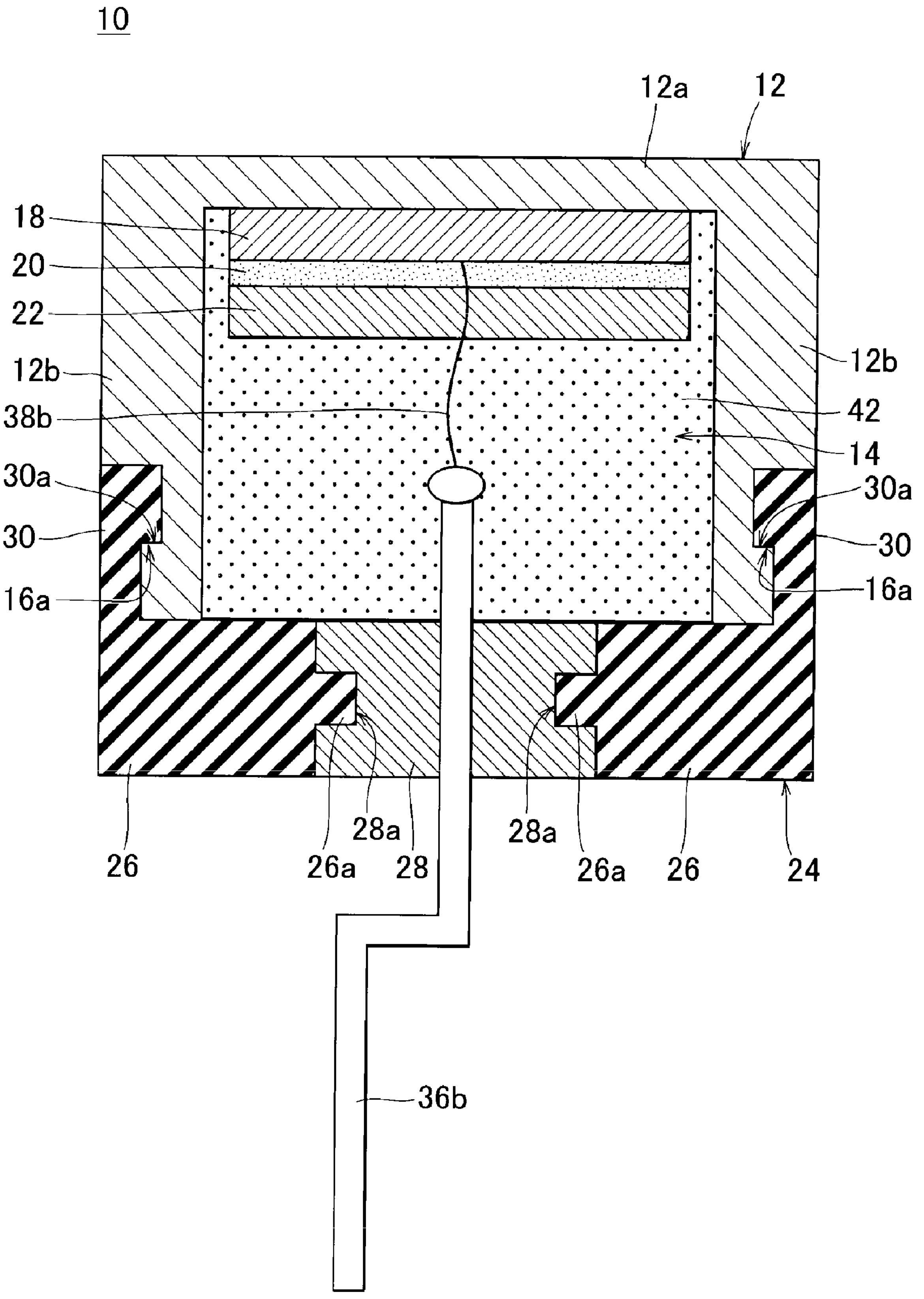
FIG. 3 is a cross-sectional view showing the ultrasonic sensor taken along a line B-B shown in FIG. 1.

FIG. 2 is a cross-sectional view taken along a line A-A shown in FIG. 1. FIG. 3 is a cross-sectional view taken along a line B-B shown in FIG. 1.

Figure 4:
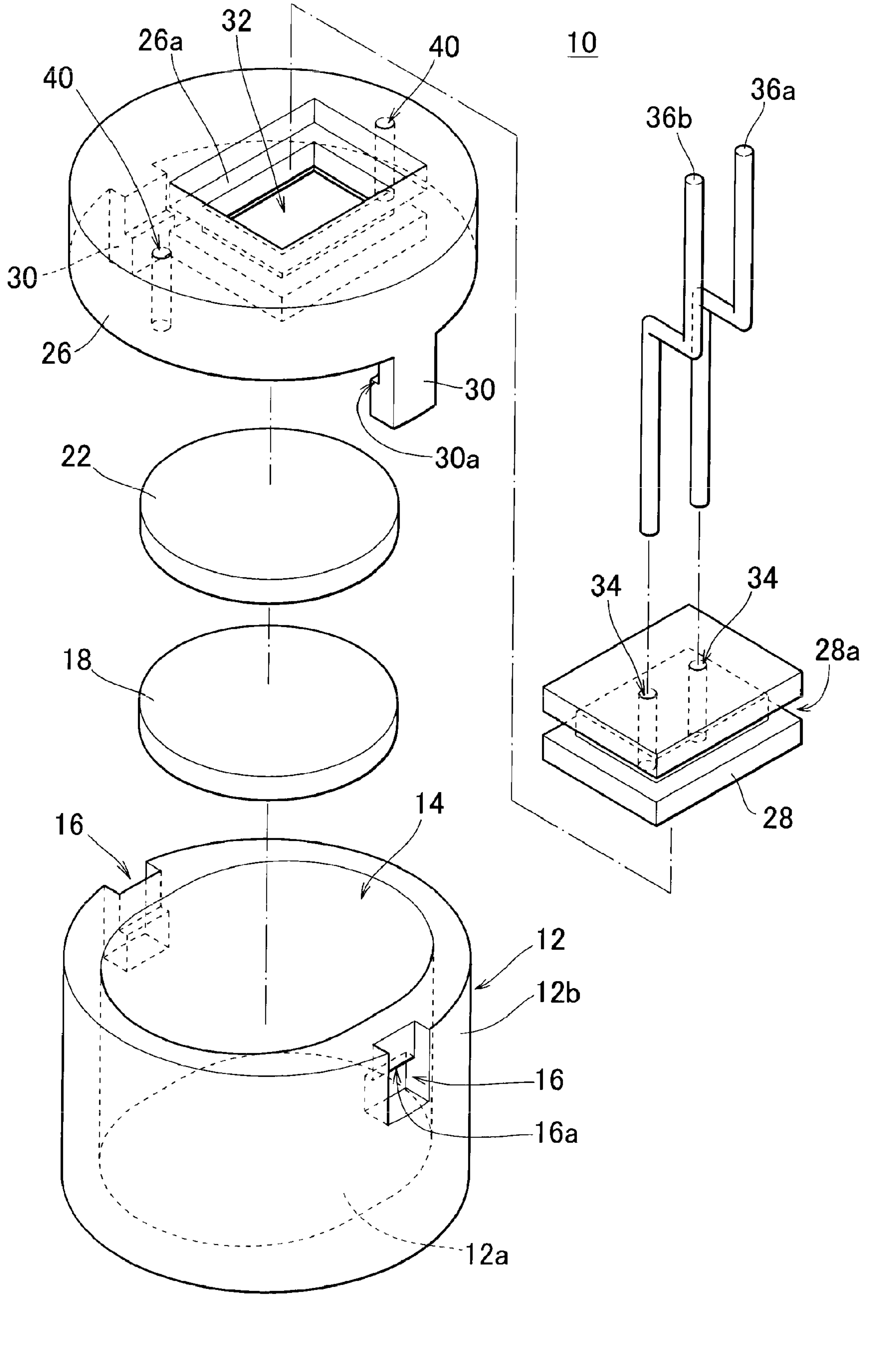
FIG. 4 is an exploded perspective view showing the ultrasonic sensor shown in FIG. 1.

An ultrasonic sensor 10 includes a cylindrical case 12 with a bottom portion. In particular, the case 12 includes a bottom portion 12*a* and a side wall 12*b*. The case 12 is made of a metal material, for example, aluminum. As shown in FIG. 4, a hollow portion 14 is provided in the case 12. For example, the hollow portion 14 is configured such that both ends thereof are curved and portions between the ends are linear, so as to have a long cross section. The wall thickness of opposite portions of the side wall 12*b* of the case 12 is relatively small, and the wall thickness of residual opposite portions substantially perpendicular to the former opposite portions is relatively large. Since the spread of the ultrasonic generated from the ultrasonic sensor 10 is dependent on the shape of the hollow portion 14, the shape of the hollow portion 14 is designed in accordance with a desired property.

In the portions with the relatively large wall thickness of the case 12, recesses 16 are provided at the outer side of the side wall 12*b* of the case 12. Each recess 16 extends toward the bottom portion 12*a* from an end of the case 12 near the opening. The depth of the recess 16 is relatively small near the opening of the case 12, and the depth thereof is relatively large near the bottom portion 12*a*. In other words, steps 16*a* are provided in the recesses 16. The steps 16*a* are substantially parallel to the end of the case 12 near the opening. The recesses 16 are provided to fix a cap (described below).

In the case 12, a piezoelectric element 18 is attached to an inner side of the bottom portion 12*a*. The piezoelectric element 18, for instance, includes a piezoelectric substrate which is a substantially circular plate or a substantially rectangular plate, and electrodes provided on both sides of the piezoelectric substrate. The electrode on one side of the piezoelectric element 18 is bonded on the bottom portion 12*a* with a conductive adhesive or other suitable adhesive. An adhesive layer 20 is provided on the electrode disposed on the other side of the piezoelectric element 18, and then a felt 22 is bonded on the adhesive layer 20. The felt 22 absorbs the ultrasound emitted from the piezoelectric element 18 to the inside of the case 12. Also, the felt 22 allows the piezoelectric element 18 to vibrate without being disturbed by the foamable resin (described below).

A cap 24 is attached to the opening of the case 12. The cap 24 includes a fixing portion 26 for fixing the cap 24 to the case 12, and a substrate 28 which is disposed at a central portion of the fixing portion 26. The fixing portion 26 is made of a relatively soft resin material, such as silicon rubber, for example. The fixing portion 26 has a disk shape having an outer diameter similar to an outer diameter of the case 12. In addition, protrusions 30 are provided at opposite portions of the disk shaped fixing portion 26. The protrusions 30 extend from the fixing portion 26 in a thickness direction. Each protrusion 30 is relatively thin at a portion near the fixing portion 26 and relatively thick at a portion distant from the fixing portion 26. In other words, steps 30*a* are respectively formed at intermediate portions of the protrusions 30.

The fixing portion 26 is attached to the opening of the case 12. At this time, by pressing the fixing portion 26 toward the opening of the case 12, the protrusions 30 of the fixing portion 26 are engaged with the recesses 16 of the case 12 to define engaging portions. The steps 16*a* of the recesses 16 engage the steps 30*a* of the protrusions 30, and thus, the fixing portion 26 is fixed to the case 12. Since the fixing portion 26 is made of the relatively soft resin material, such as silicon rubber, the protrusions 30 of the fixing portion 26 may be easily fitted to the recesses 16 of the case 12.

The fixing portion 26 includes a hole 32 having, for example, a substantially rectangular shape, at the central portion thereof. A protrusion 26*a* is provided on an inner wall of the hole 32 at an intermediate portion in a thickness direction of the fixing portion 26. The protrusion 26*a* extends around substantially the entire inner periphery of the hole 32. The substrate 28 is fitted to the hole 32. For example, the substrate 28 is made of a rigid material, such as polyphenylene sulfide (PPS), for example, which is harder than the silicon rubber. The substrate 28 has a substantially rectangular shape corresponding to the shape of the hole 32 of the fixing portion 26. A recessed portion 28*a* is provided in the periphery of the substrate 28 corresponding to the protrusion 26*a*. By pushing the substrate 28 into the hole 32 of the fixing portion 26, the protrusion 26*a* of the fixing portion 26 is engaged with the recessed portion 28*a* of the substrate 28 so as to define engaging portions. Accordingly, the substrate 28 is fixed to the fixing portion 26. Since the fixing portion 26 is made of the relatively soft resin material, the substrate 28 may be easily engaged with the fixing portion 26.

The substrate 28 includes two terminal holes 34, to which terminals 36*a* and 36*b* are press-fitted. The terminals 36*a* and 36*b* are made of a conductive material such as metal, and portions thereof located at the outside of the cap 24 are bent in a crank shape. The bent portions of the terminals 36*a* and 36*b* prevent the terminals 36*a* and 36*b* from falling through holes penetrating a printed circuit board (not shown) when the ultrasonic sensor 10 is mounted on the printed circuit board, and may provide a gap between the case 12 and the printed circuit board.

In the case 12, the one terminal 36*a* is connected to the case 12 via a wire 38*a*, and is electrically connected to the electrode on the one side of the piezoelectric element 18 via the case 12. The other terminal 36*b* is electrically connected to the electrode on the other side of the piezoelectric element 18 via a wire 38*b*. For example, solder is used for connection between the case 12, the piezoelectric element 18, the terminals 36*a* and 36*b*, and the wires 38*a* and 38*b*.

In addition, the fixing portion 26 includes, for example, two through holes 40 having a substantially circular shape, in opposite portions of the substrate 28. The through holes 40 are configured such that a sectional area thereof is determined by conditions of $Sh \leqq 5$ ($mm^2$), and $0.02 \leqq Sh/Sc \leqq 0.3$, where Sc is a sectional area of the opening of the case 12, and Sh is the sectional area of the through holes 40 provided in the fixing portion 26 of the cap 24.

The inside of the case 12 and the inside of the through holes 40 provided in the fixing portion 26 are filled with foamable resin 42 such as foamable silicon. The foamable resin 42 before being foamed is injected from first ends of the through holes 40, and heated to be foamed and cured. At this time, since the through holes 40 are configured such that the sectional area thereof is determined by the above-described conditions, an excess amount of foamable resin 42 is pushed out from the through holes 40, and the foamable resin 42 may be expanded in the case 12 with a suitable internal pressure. Therefore, all corners of the case 12 may be filled with the foamable resin 42, and the inside of the case 12 may be filled with the foamable resin 42 evenly.

If the sectional area of the through holes 40 is too large, when the resin injected into the case 12 is foamed, the foamable resin 42 is likely to be pushed out from the through holes 40. As a result, a suitable internal pressure may not be provided. Because of this, the foamable resin 42 may not be injected into the corners of the case 12. On the other hand, if the sectional area of the through holes 40 is too small, when the resin injected into the case 12 is foamed, the excess amount of foamable resin 42 may not be pushed out from the through holes 40, the cap 42 may be lifted up, and may be deformed. Because of this, the foamable resin 42 may be unevenly filled in the case 12.

Where the ultrasonic sensor 10 is used as a backup sensor of an automobile, the piezoelectric element 18 is excited by applying a drive voltage to the terminals 36*a* and 36*b*. Although the piezoelectric element 18 is surrounded with the foamable resin 42, the vibration region of the piezoelectric element 18 may be secured by the felt 22 bonded to the piezoelectric element 18. As the piezoelectric element 18 is vibrated, the bottom 12*a* of the case 12 is vibrated, which causes ultrasound to be emitted to a direction substantially perpendicular to the bottom 12*a*. When the ultrasound emitted from the ultrasonic sensor 10 is reflected by an object to be detected and reaches the ultrasonic sensor 10, the piezoelectric element 18 is vibrated. The vibration is converted into an electric signal, and the electric signal is output from the terminals 36*a* and 36*b*. A period of time from the application of the drive voltage to the output of the electric signal is measured, so that a distance between the ultrasonic sensor 10 and the object to be detected may be measured.

With the ultrasonic sensor 10, since the inside of the case 12 is evenly filled with the foamable resin 42, the vibration of the entire case 12 may be reduced. While the ultrasound emitted from the piezoelectric element 18 to the inside of the case 12 is absorbed by the felt 22, the ultrasound passing through the felt 22 is dispersed and absorbed by the large number of pores in the foamable resin 42. This may efficiently reduce not only the vibration of the case 12, but also the ultrasound remaining in the case 12, thereby improving a reverberation property.

Figure 5A:
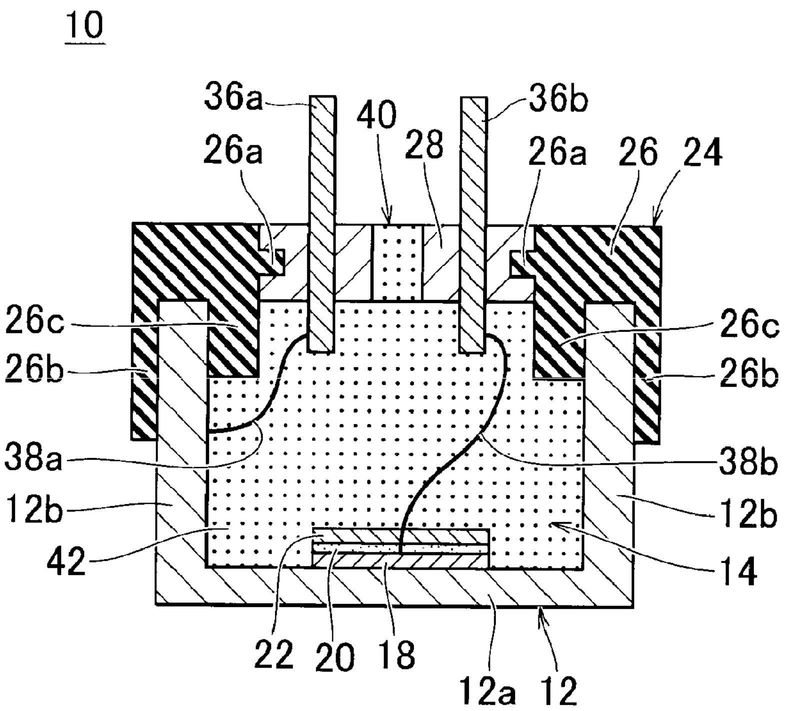
FIG. 5A is a cross-sectional view showing an ultrasonic sensor according to another preferred embodiment of the present invention.
Figure 5B:
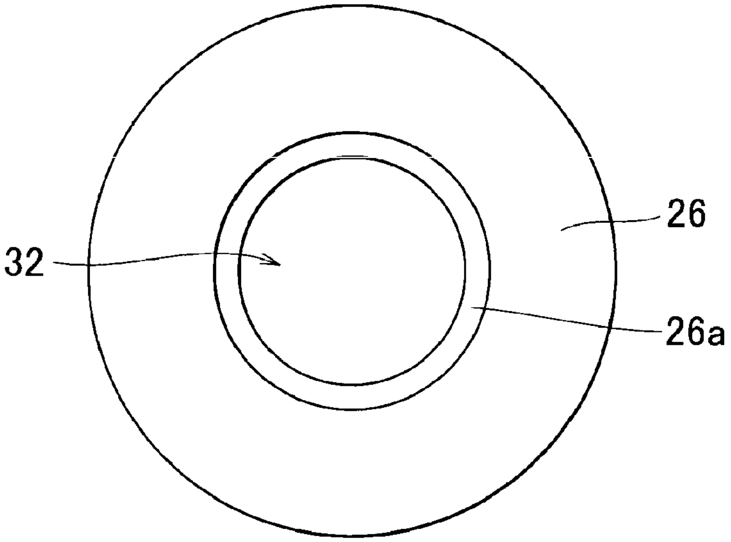
FIG. 5B is a plan view showing a fixing portion used for the ultrasonic sensor.
Figure 5C:
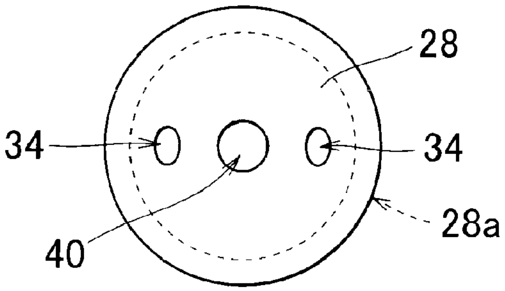
FIG. 5C is a plan view showing a substrate used for the ultrasonic sensor.
Figure 6:
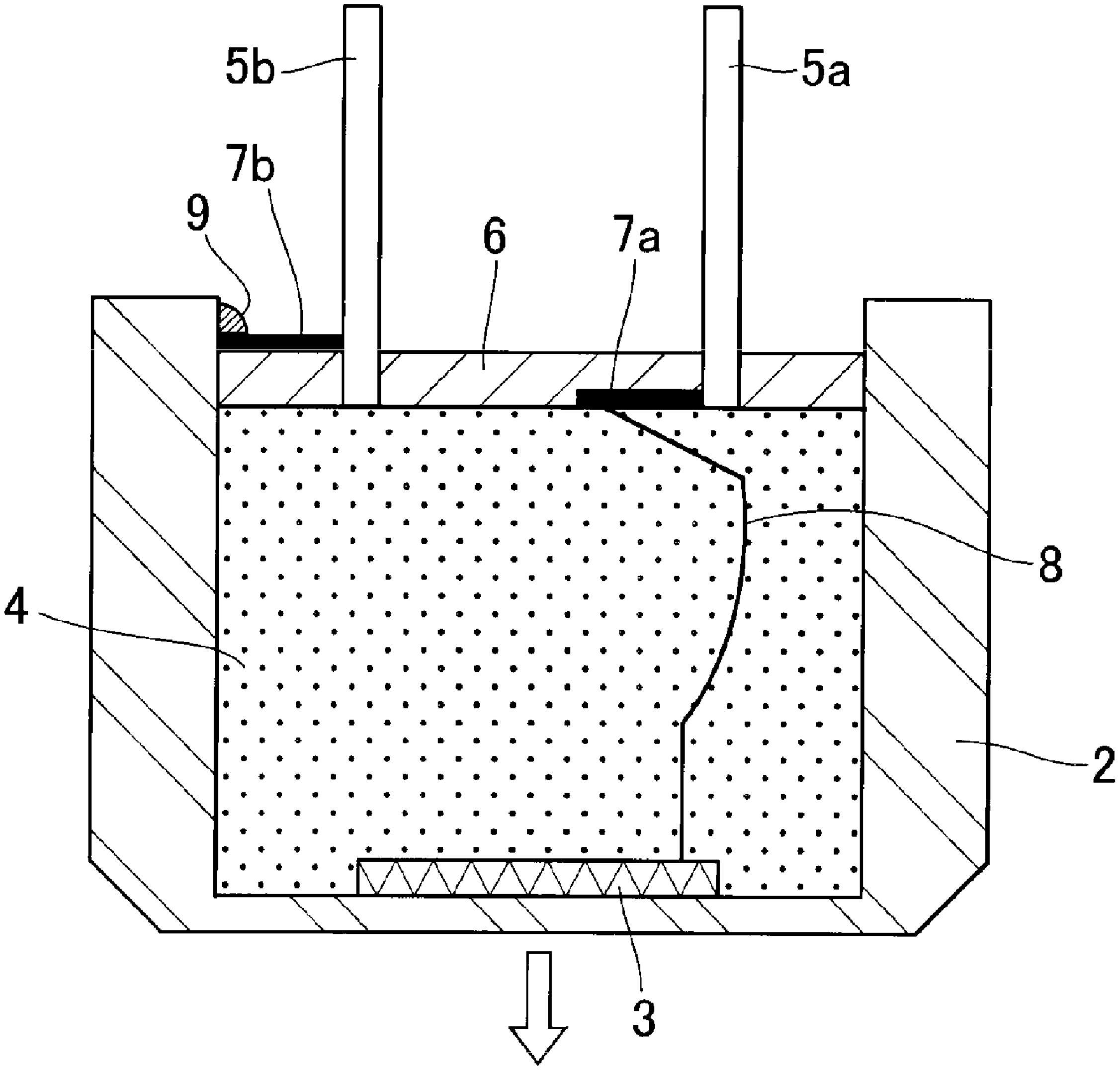
FIG. 6 Prior Art
FIG. 6 is a schematic illustration showing an exemplary ultrasonic sensor according to a related art of the present invention.

In the ultrasonic sensor 10, as shown FIG. 5A to 5C, the opening of the case 12 may be substantially circular, and the cap 24 may be attached by fitting the relatively soft fixing portion 26 in the opening. The fixing portion 26 preferably has a disk shape. Also, concentrically arranged fitting protrusions 26*b* and 26*c* are provided respectively at the peripheral edge and at the inner side of the peripheral edge of the fixing portion 26. Since the fitting protrusions 26*b* and 26*c* are concentrically arranged, a circular groove or substantially circular groove is provided between the fitting protrusions 26*b* and 26*c*. The end of the side wall 12*b* of the case 12 near the opening is fitted into the groove, so that the fixing portion 26 is attached to the case 12. Where the hollow portion 14 in the case 12 has a shape other than the substantially circular shape, the hollow portion 14 may be provided at a deep portion in the substantially circular case 12, the deep portion being distant from the end of the side wall 12*b* near the opening. This configuration allows the shape of the end of the side wall 12*b* of the case 12 near the opening to be substantially circular. Accordingly, the substantially circular fixing portion 26 may be attached to the case 12 regardless of the shape of the hollow portion 14.

At this time, the hole 32 of the fixing portion 26 and the substrate 28 attached to the fixing portion 26 also have substantially circular shapes. In the ultrasonic sensor 10 shown in FIG. 5, a through hole 40 is provided at an approximate center portion of the substrate. The opening of the case 12, the fixing portion 26, and the substrate 28 are concentrically arranged.

As described above, since the opening of the case 12, the fixing portion 26, and the substrate 28 have a substantially circular shape, and are concentrically arranged, a stress applied from the fixing portion 26 to the substrate 28 may be equally distributed. The position of the substrate 28 is not shifted with respect to the case 12 and the fixing portion 26, and thus, the positional accuracy of the terminals 36*a* and 36*b* attached to the substrate 28 may be improved. Accordingly, the ultrasonic sensor 10 having the terminals 36*a* and 36*b* located at the designed positions may be provided, and thus, the ultrasonic sensor 10 may be suitable for automated mounting.

In the above-described preferred embodiments, while the cap 24 is formed by assembling the relatively soft fixing portion 26 and a relatively hard substrate 28 that is harder than the fixing portion 26, the cap 24 may be made of one material.

In such a case, the cap 24 may be preferably made of a relatively hard material so as to increase a fixing strength of the terminals 36*a* and 36*b*.

Example 1

The ultrasonic sensor having the structure shown in FIGS. 1 to 4 was manufactured. First, the piezoelectric element 18 was attached to the inner side of the bottom of the case 12 made of aluminum. First ends of the wires 38*a* and 38*b* were soldered to the piezoelectric element 18 and to the side wall of the case 12. The felt 22 was bonded to the piezoelectric element 18. Meanwhile, the terminals 36*a* and 36*b* were press-fitted to the terminal holes 34 provided in the substrate 28 made of PPS, and the substrate 28 was fitted to the fixing portion 26 made of silicon rubber. Second ends of the wires 38*a* and 38*b* were soldered to the terminals 36*a* and 36*b* press-fitted to the substrate 28, and the fixing portion 26 was fitted to the case 12. Foaming silicon was injected into the case 12 from the through holes 40 provided in the fixing portion 26, and the foamable silicon was heated at about 60° C. so as to be foamed and cured. At this time, the foamable silicon pushed out from the through holes 40 was removed, and thus, the ultrasonic sensor was manufactured. Using this ultrasonic sensor, the sectional area of the through holes 40 provided in the fixing portion 26 of the cap 24 was varied, so as to observe the filling state of the foamable silicon in the case 12 and evaluate the results. The results were shown in Table 1.

TABLE 1

| Sample No. | Sh ($mm^2$) | Sc ($mm^2$) | Sh/Sc | Evaluation | State |
|---|---|---|---|---|---|
| 1 | 0.2 | 250 | $8 \times 10^{-4}$ | Not Good | Foaming Si not pushed out, uneven filling, fixing portion deformed |
| 2 | 5 | 250 | $2 \times 10^{-2}$ | Good | Good |
| 3 | 20 | 250 | $8 \times 10^{-2}$ | Not Good | Uneven filling |
| 4 | 5 | 100 | $5 \times 10^{-2}$ | Good | Good |
| 5 | 5 | 15 | $3 \times 10^{-1}$ | Good | Good |
| 6 | 8 | 15 | $5 \times 10^{-1}$ | Not Good | Uneven filling |
| 7 | 10 | 15 | $7 \times 10^{-1}$ | Not Good | Uneven filling |

As shown in the results of Sample Nos. 3, 6 and 7 in Table 1, when the sectional area Sh of the through holes 40 was above about 5 ($mm^2$), or the ratio Sh/Sc of the sectional area Sh of the through holes 40 to the sectional area Sc of the opening of the case 12 was above about 0.3, the foamable silicon was likely to be pushed out from the through holes 40 when the foamable silicon was foamed. As a result, only a small internal pressure was provided in the case 12. Accordingly, the case 12 could not be evenly filled with the foamable silicon. As shown in the result of Sample No. 1 in Table 1, when the Sh/Sc was below about 0.02, the excess amount of foamable silicon was not pushed out from the through holes 40. Due to this, the internal pressure of the case 12 increased, the filling state of the foamable silicon became uneven, and the fixing portion 26 of the cap 24 was deformed. In contrast, as long as the conditions of $Sh \leqq 5$ ($mm^2$), and $0.02 \leqq Sh/Sc \leqq 0.3$ were satisfied, the case 12 could be evenly filled with the foamable silicon.

Example 2

The ultrasonic sensor having the structure shown in FIG. 5 was manufactured. The ultrasonic sensor was manufactured in a similar manner to Example 1 except that the opening of the case 12, the fixing portion 26, and the substrate 28 were configured to have a substantially circular shape, and were concentrically arranged. As a comparative example, an ultrasonic sensor was manufactured in which the shape of the substrate 28 was ellipsoidal and the terminals 36*a* and 36*b* were aligned in a longitudinal direction of the substrate. For those ultrasonic sensors, the positional accuracy of the terminals 36*a* and 36*b* was measured. The center of the case 12 was the reference of the positional accuracy of the terminals 36*a* and 36*b*, and the shifting amount of the terminals 36*a* and 36*b* from the designed positions was measured with respect to the reference. The shifting amount was measured in two directions (X-direction and Y-direction) including a direction along the terminals 36*a* and 36*b*, and in a direction substantially thereto. The number of samples for the measurement was ten for the ultrasonic sensor according to various preferred embodiments of the present invention, and ten for the comparative example. An average and a standard deviation ($\sigma n-1$) were calculated for each sample, and the results were shown in Table 2.

TABLE 2

| | X-direction positional shift of terminals (average) (mm) | X-direction positional shift of terminals ($\sigma n-1$) (mm) | Y-direction positional shift of terminals (average) (mm) | Y-direction positional shift of terminals ($\sigma n-1$) (mm) |
|---|---|---|---|---|
| Present invention | 0.06 | 0.03 | 0.05 | 0.02 |
| Comparative example | 0.25 | 0.14 | 0.21 | 0.12 |

As shown in Table 2, even though the assembly method of the ultrasonic sensor of preferred embodiments of the present invention was simple such that the substrate 28 was merely fitted to the fixing portion 26 made of silicon rubber, the terminals 36*a* and 36*b* could be disposed with a markedly improved positional accuracy.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An ultrasonic sensor comprising:

a case having an opening and a bottom portion;

a piezoelectric element disposed on an inner side of the bottom of the case;

foamable resin injected into the case so as to surround the piezoelectric element;

a cap attached to the opening of the case;

a terminal attached to the cap so as to be electrically connected to the piezoelectric element; and a through hole provided in the cap.

2. The ultrasonic sensor according to claim 1, wherein a sectional area of the through hole is determined by the following conditions:

$Sh \leqq 5$ ($mm^2$), and $0.02 \leqq Sh/Sc \leqq 0.3$, where Sc is a sectional area of the opening of the case, and Sh is the sectional area of the through hole formed in the cap.

3. The ultrasonic sensor according to claim 1, wherein the cap includes a soft fixing portion which is fixed to the case, and a substrate which is provided in the fixing portion and is harder than the fixing portion; and the terminal is attached to the substrate.

4. The ultrasonic sensor according to claim 3, wherein the case and the fixing portion are fixed by mating portions, and the fixing portion and the substrate are fixed by mating portions.

5. The ultrasonic sensor according to claim 3, wherein the opening of the case, the fixing portion, and the substrate have substantially circular shapes, and the opening of the case, the fixing portion, and the substrate are concentrically arranged.

* * * * *